United States Patent
Shindo et al.

(10) Patent No.: US 6,873,164 B2
(45) Date of Patent: Mar. 29, 2005

(54) METHOD OF MEASURING ELECTRON ENERGY DISTRIBUTION IN PLASMA REGION AND APPARATUS FOR MEASURING THE SAME

(75) Inventors: Haruo Shindo, 910-1-6-301, Aiko, Atsugi-shi, Kanagawa-ken (JP); Takayuki Fukasawa, Yamanashi (JP)

(73) Assignees: Haruo Shindo, Atsugi (JP); Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/935,585

(22) Filed: Aug. 24, 2001

(65) Prior Publication Data

US 2002/0043985 A1 Apr. 18, 2002

(30) Foreign Application Priority Data

Aug. 25, 2000  (JP) ........................................ 2000-256399

(51) Int. Cl.[7] ........................ G01R 31/302; G01N 27/62
(52) U.S. Cl. ........................................................ 324/750
(58) Field of Search ................................. 324/750, 760, 324/464–470

(56) References Cited

U.S. PATENT DOCUMENTS 5,703,488 A  * 12/1997 Ohmi et al. ................. 324/464

FOREIGN PATENT DOCUMENTS

| JP | 64-061000 | * 3/1989 | ............ H05H/1/00 |
|---|---|---|---|
| JP | 2-30098 | 1/1990 | |

* cited by examiner

*Primary Examiner*—Evan Pert
*Assistant Examiner*—Partesh Patel
(74) *Attorney, Agent, or Firm*—Oblon, Spivak, McClelland, Maier & Neustadt, P.C.

(57) ABSTRACT

A method of an electron energy distribution in a plasma region generated by high-frequency power. In the method, a heating probe is inserted into the plasma region and heated by a current flowing into the plasma region. A pulse voltage having a sufficient shorter period than a thermal time constant of the heating probe is applied to the probe, which emits thermions. The number of the thermions emitted sufficiently increases. The plasma vibration frequency of the emitted thermions is sufficiently higher than the frequency of the high-frequency power. The floating potential of the heating probe therefore follows the high frequency potential existing in the plasma. The floating potential difference between a voltage period of the pulse voltage and a no-voltage period is detected, and an the electron energy distribution in the plasma region is thereby determined.

11 Claims, 6 Drawing Sheets

METHOD OF MEASURING ELECTRON ENERGY DISTRIBUTION IN PLASMA REGION AND APPARATUS FOR MEASURING THE SAME

CROSS-REFERENCE TO RELATED APPLICATIONS

This application is based upon and claims the benefit of priority from the prior Japanese Patent Application No. 2000-256399, filed Aug. 25, 2000, the entire contents of which are incorporated herein by reference.

BACKGROUND OF THE INVENTION

1. Field of the Invention

The present invention relates to a method for measuring an electron energy distribution in a plasma region in a film forming apparatus or a plasma etching apparatus, in which plasma is generated by using a high frequency power, thereby to form film. The invention relates to an apparatus for measuring the same.

2. Description of the Related Art

Generally, in a plasma processing apparatus utilizing plasma generated by high frequency power application to perform various film formings, which is represented by the plasma CVD, the plasma sputtering the plasma etching, it is essential that plasma be generated stably and with excellent reproducibility. Therefore, it is necessary to measure electron energy distribution in plasma to control generation of the plasma on the basis of the measured results. Particularly, since the plasma is generated by high frequency power in almost all cases, it is important to perform measurement of the electron energy distribution in the high frequency plasma accurately.

Conventionally, such a method is widely employed that, by utilizing the fact that the relationship between an electron current collected from a probe or a heating probe inserted in the plasma region and the electron temperature of a plasma (one of the bias voltage and the plasma energy of the probe,) is a constant the plasma electron temperature is measured.

In such a method, however, there is such a drawback that it is necessary to arrange a complicated protection circuit in order to remove the influence of high frequency potential vibration which always exists in the plasma region on the probe. In a method for determining an electron temperature using such a probe, since a voltage-current characteristic of a probe which has a non-linear characteristic, and the plasma potential vibrates due to the high frequency vibration of a power supply voltage, a settling current generated by this vibration is captured in the probe simultaneously with the electron current. Therefore, the current captured by the probe is different from the electron current reflecting the accurate electron temperature, so that control on plasma generation is made impossible in principle.

As a measure to solve this drawback, a new high frequency current removing circuit is added to this probe circuit and the settling current is cancelled by applying to the probe a high frequency voltage having the same magnitude as the vibration voltage in the plasma and an inverse phase to the phase of the vibration voltage.

In this method, however, since the voltage value with the inverse phase to be applied to the probe depends on a capacitance of a sheath existing between the probe and the plasma, it is difficult to obtain the electron current and it is difficult to apply a voltage having the inverse phase and exactly the same value as the plasma potential to the probe circuit.

In view of the above, the present inventor has proposed in a Jpn. Pat. Appln. KOKAI No. 2-30098 publication a technique where a probe is maintained in a state that it can emit thermal electrons, a half wave voltage of an alternative current is applied to the probe, a floating potential difference between a no-voltage period and a voltage period is obtained so that a plasma electron temperature is measured on the basis of the difference. However, in this technique, there is included such a problem that an electron temperature corresponding to an average energy in Maxwell distribution can only be measured and a general electron energy distribution can not be measured.

BRIEF SUMMARY OF THE INVENTION

An object of the present invention is to provide a method of measuring an electron energy distribution in the plasma accurately, in a film forming apparatus or a plasma etching apparatus, which is designed to form film by generating plasma by a high frequency power. Another object of the invention is to provide an apparatus for realizing the method.

According to an aspect of the present invention, there is provided a measuring method of an electron energy distribution in a plasma region generated by application of a high frequency power, comprising the steps of: inserting a heating probe which can be heated by current flow; applying a pulse voltage having a sufficient shorter period than a thermal time constant of the heating probe to maintain the heating probe in a state where the heating probe can emit thermions; setting a state where the number of the thermions emitted sufficiently increases and the number of plasma vibrations of the emitted thermions is set to be sufficiently higher than the frequency of the high frequency power to cause the floating potential of the heating probe to follow a high frequency potential existing in the plasma; detecting a floating potential difference between a voltage period (H level) of the pulse voltage and a no-voltage period (L level) while changing the H level of the pulse voltage variously; and obtaining an electron energy distribution in the plasma region on the basis of the detected value.

According to anther aspect of the present invention, there is provided a measuring apparatus for measuring an electron energy distribution in a plasma region generated by a high frequency power, comprising: a heating probe having a probe portion which is inserted into the plasma region to be heated by application of a pulse voltage; a pulse power supply which applies heating pulses to the heating probe to heat the probe portion up to a state that the probe portion can emit thermions; a detecting section which detects the difference in the floating voltage between a voltage period (H level) and a no-voltage period (L level) of the pulse voltage; and a calculating section which obtains an electron energy distribution in the plasma region on the basis of the detected value detected by the detecting portion.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

An embodiment of the present invention will be explained below in detail with reference to the drawings.

One embodiment of a measuring method of an electron energy distribution in plasma and an apparatus thereof according to the present invention will be explained with reference to the drawings.

First of all, an emission probe process using a measuring method according to the present invention will be explained with reference to FIG. 1.

Figure 1:
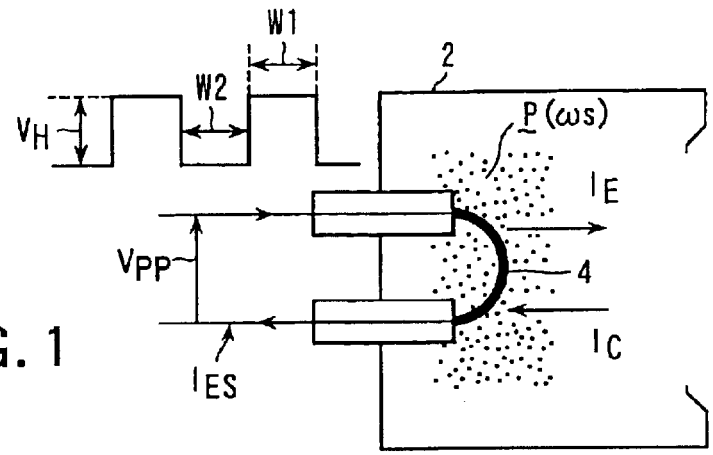
FIG. 1 is principle diagram for explaining an emission probe method used in a measuring method according to the present invention.

FIG. 1 shows a state that a heating probe (filament portion) 4 exposed in an arc manner is inserted into plasma generation region P generated in a chamber (high frequency plasma generating chamber) 2, which is put in a vacuum state. The heating probe 4 is not electrically connected to a chamber 2 and the potential thereof is put in a floating state.

In the art disclosed in the above-mentioned Jpn. Pat. Appln. KOKAI No. 2-30098, an alternating current is applied to the heating probe 4. In the present invention, a pulse voltage $V_{PP}$ is applied to the probe instead of such a half wave voltage, and further while the height $V_H$ of the pulse voltage is varied, data is obtained for each change.

For example, as shown in FIG. 1, it is assumed that the pulse width W1 is set to 10 to 15 μsec, the interval between pulses W2 is set to 20 to 35 μsec, and the frequency of the pulse is set to 20 to 30 kHz or so. In this embodiment, a pulse voltage $V_{PP}$ (period is sufficiently short than a filament thermal time constant) with a voltage period (H level) and a no-voltage period (L level) is applied to the heating probe 4 to heat the same so that the heating probe 4 emits thermions (emission electrons). The difference $\Delta V_F$ of the floating potential of the heating probe 4 between the voltage period and the no-voltage period of the pulse voltage $V_{PP}$ is set such that the amount or quantity to be measured is not affected by the emission electron current under the conditions that the number of the emission electrons is sufficiently large and the floating potential of the heating probe 4 can follow the high frequency potential vibration existing in the plasma region P. Thereby, all of the above-mentioned drawbacks in the conventional art can be solved.

Next, the measuring principle of the present invention will be explained.

As shown in FIG. 1, there is the plasma region P generated by high frequency power of an angular frequencies ωs in the chamber 2, the heating probe 4 is inserted into the plasma region P, and the probe 4 is heated by the pulse voltage $V_{PP}$ whose pulse height is VH. At this time, when an emission electron saturated current $I_{ES}$ meets the condition of the equation (1) shown below, the floating potential of the heating probe can follow the high frequency potential vibration in the plasma.

$$\omega_{PE} = \left(\frac{n_E \cdot e^2}{\varepsilon_0 \cdot m}\right)^{1/2} = \left(\frac{I_{ES} \cdot e}{A_P \cdot \varepsilon_0 \cdot m}\right)^{1/2} (k \cdot T_W / 2\pi m)^{-1/4} \gg \omega_S, \quad (1)$$

where $\omega_{PE}$ is the number of plasma vibrations of emission electrons (electron density $n_E$), $\varepsilon_0$ is the dielectric constant in vacuum, e and m are electron charge and mass, $A_P$ is a probe surface area, $T_W$ is a probe temperature, and k is Boltzmann's constant.

The relationship of the above equation (1) means that the number of plasma vibrations of the emission electrons is sufficiently more than the number of potential vibrations in plasma. However, under this condition, the emission electrons rapidly follow the vibration potential in the plasma so that the potential vibration of high frequency between the heating probe 4 and the probe is cancelled.

This aspect or behavior will be explained with reference to FIGS. 2A and 2B.

Figure 2A:
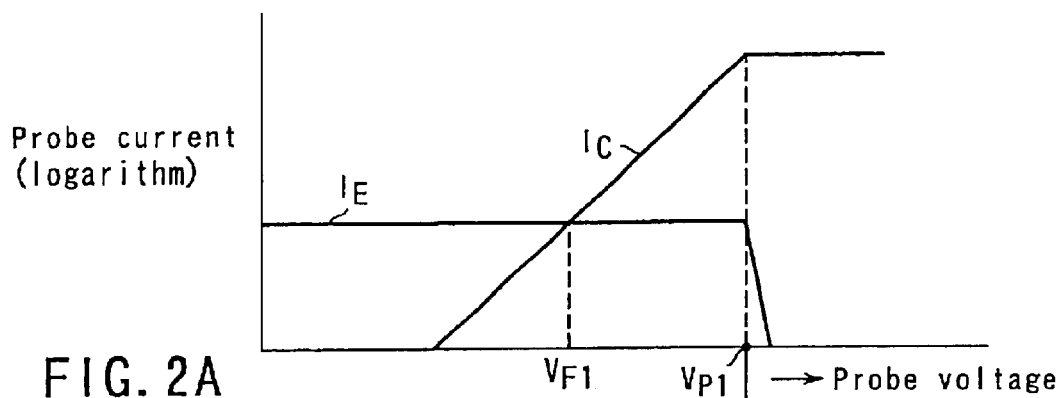
FIGS. 2A and 2B are graphs of probe currents obtained when a voltage of a high frequency power generating plasma is in a positive phase and when it is in an opposite phase, respectively.
Figure 2B:
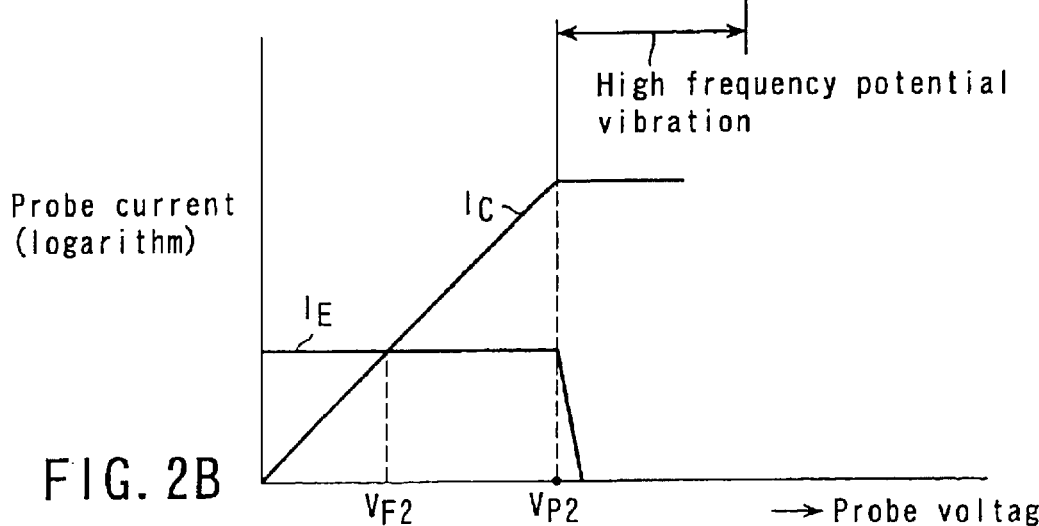

FIGS. 2A and 2B are graphs showing probe currents obtained when a voltage of a high frequency power generating plasma is in a positive phase and when it is in an opposite phase, respectively. That is, FIG. 2A shows a relationship between emission electron current $I_E$ and collection electron current $I_C$ obtained when a high-frequency power supply voltage remains in a positive phase, while FIG. 2B shows a relationship between emission electron current $I_E$ and collection electron current $I_C$ obtained when a high-frequency power supply voltage remains in a reversed phase. Here, the emission electron current is a current generated by thermions emitted from a filament, and the collection electron current is a current generated when the plasma electrons reach the filament. The directions of both the currents are reversed to each other. Also, FIG. 3 is a graph showing a change of a probe current flowing when a pulse voltage is applied to the heating probe.

In FIGS. 2A and 2B, even when the plasma potentials are changed from $V_{P1}$ to $V_{P2}$ according to the respective phases, the emission electrons rapidly follow the vibration of the plasma potential, so that the emission electron current and the collection electron current are put in a state where they have been moved in parallel to each other along the horizontal axis (probe voltage). Incidentally, in FIGS. 2A and 2B, the plus/minus of either one of the currents, for example, the emission electron current $I_E$, has been described in a reversed manner for easy understanding of the present invention.

Accordingly, in a case that the probe is in a floating state, when the plasma potential vibrates between $V_{P1}$ and $V_{P2}$, the floating potential vibrates between $V_{F1}$ and $V_{F2}$. Therefore, since the vibration potential difference of the high frequency between the probe and the plasma is cancelled, the vibration potential is not influenced by the electrons captured or collected from the plasma. Nonetheless, the same potential difference $V_{P1}-V_{F1}(=V_{P2}-V_{F2})$ is always detected. The collection electron current is not affected by the high frequency vibration voltage and therefore accurately reflects the electron temperature (electron energy).

Figure 3:
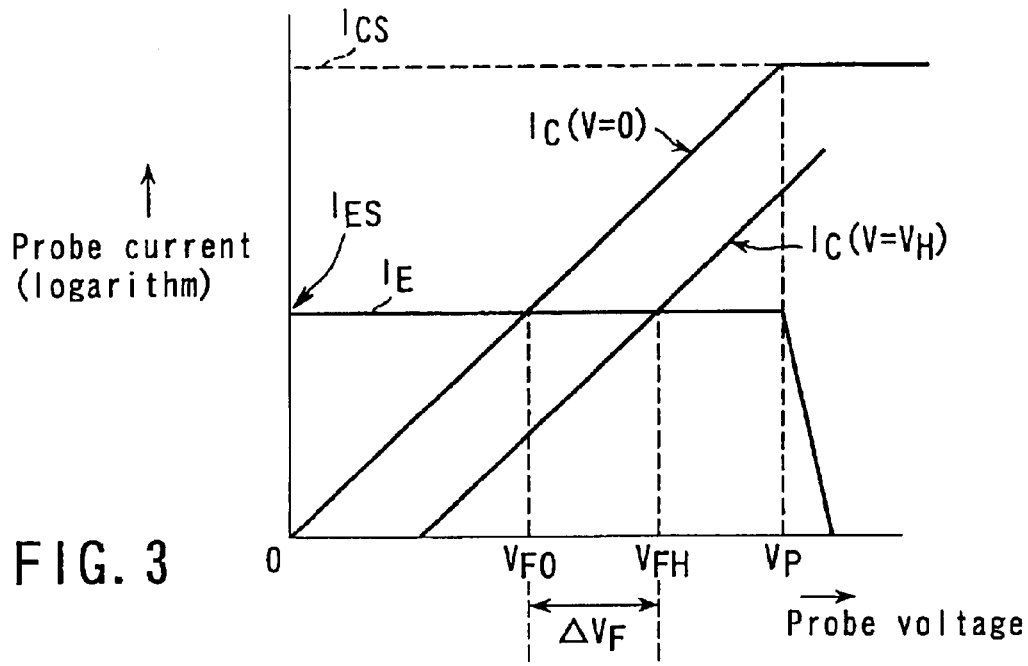
FIG. 3 is a graph showing a change of probe current obtained when a pulse voltage is applied to a heating probe.

Under such conditions, the value of the floating potential difference $\Delta V_F$ of the probe between the voltage period and the no-voltage period of the pulse voltage $V_{PP}$ depends on the slope of the collection electron current-voltage characteristic in a region of $I_{ES} < I_{CS}$ (here, $I_{CS}$ is the collection electron saturated current), as shown in FIG. 3. Assuming that the electron temperature is Te, the slope is the value of $1/k \cdot Te$, so that the electron temperature can be obtained according to the following equation (2) by measuring the floating potential difference $\Delta V_F$ to $V_H$ as shown in FIG. 3.

$$\Delta V_F = -\frac{k \cdot Te}{e} \ln\left[\frac{k \cdot T_e}{e \cdot V_H}\left\{1 - \exp\left(-\frac{e \cdot V_H}{k \cdot T_e}\right)\right\}\right] \quad (2)$$

Incidentally, the method for measuring an electron temperature using the equation (2) has been already disclosed in Jpn. Pat. Appln. KOKAI No. 64-61000. Also, when the floating potential is measured, the potential vibration responding to the vibration of the plasma potential other than the change due to the pulse voltage $V_H$ is included in the floating potential, so that this vibration component must be removed by a filter or the like.

Since the angular frequency $\omega s$ of the high frequency power supply and the frequency of the pulse voltage $V_H$ are significantly different from each other in an ordinary state, this filtering processing can be applied easily.

Such an explanation is directed to a method for measuring an electron temperature, as also disclosed in the previous application (Jpn. Pat. Appln. KOKAI No. 2-30093). In this invention, however, when the energy distribution of electrons is measured, the measurement results are obtained by changing the pulse height (H level) $V_H$ of the pulse voltage $V_{PP}$ to various levels.

Figure 4:
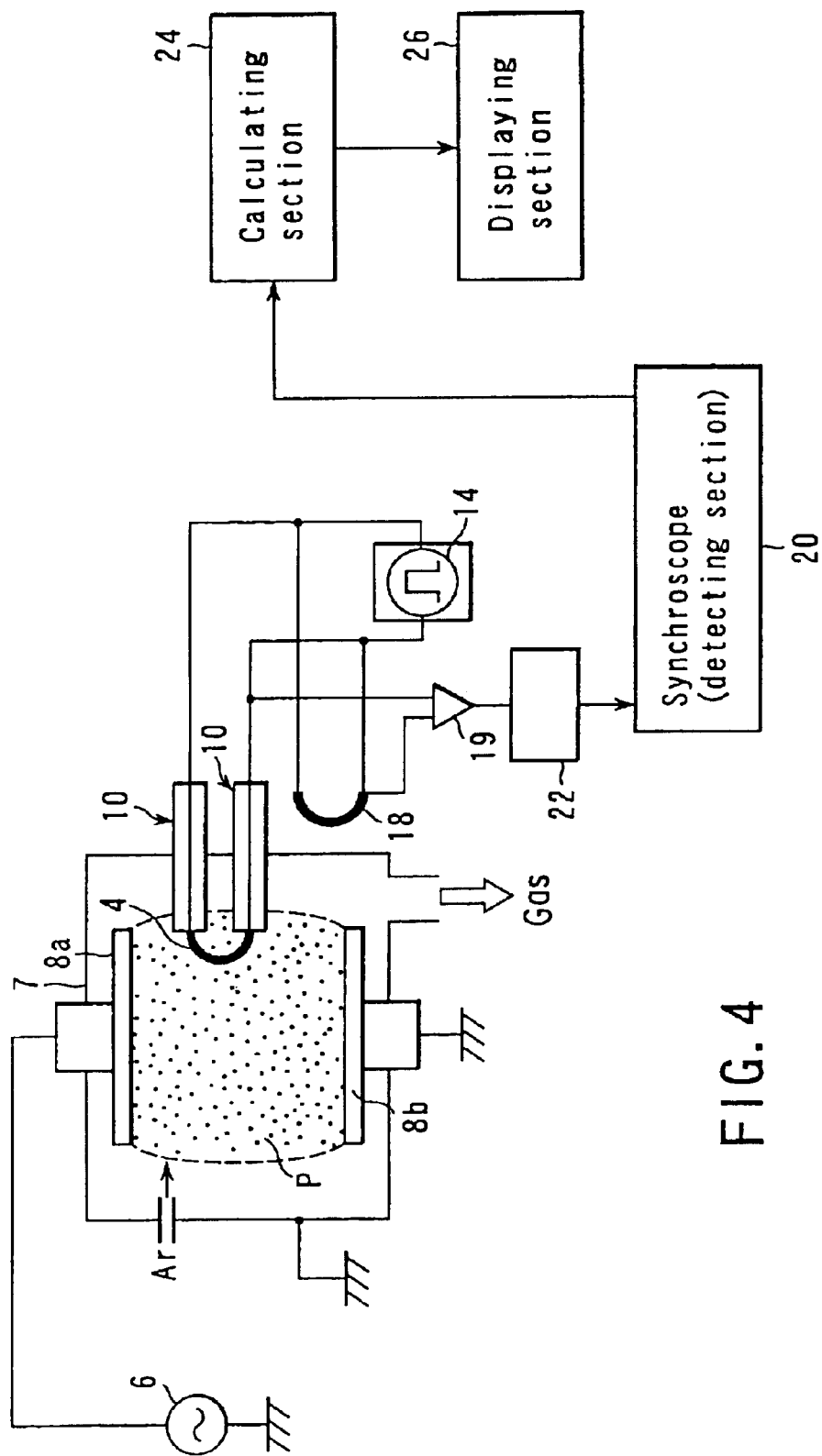
FIG. 4 is one embodiment of configuration of a measuring apparatus for measuring an electron energy distribution in plasma.

In FIG. 4, a measuring apparatus for realizing such a measuring method of an electron energy distribution is shown as one configuration embodiment, and it will be explained below.

This measuring apparatus is mounted in a chamber 7 for generating high frequency plasma, which is equipped in a plasma film forming apparatus. A pair of upper and lower electrodes 8a and 8b are provided in the chamber 7 so as to be opposed to each other in parallel, they are connected with a high frequency power supply 6 of, for example, 13.56 MHz or 27 MHz, and the chamber 7 is provided with an exhausting system (not shown) for exhausting gas (air) to an arbitrary degree of vacuum. Furthermore, a gas introducing mechanism (not shown) for introducing process gas between the upper and lower electrodes 8a and 8b is provided in the chamber 7, and plasma is generated by introducing, for example, Ar gas into the chamber 7. Then, a heating probe 4 similar to the one which has been described above with reference to FIGS. 2A and 2B is connected to introduction terminals 10 whose outer circumferential portions are insulated and which are mounted on a side wall of the chamber 7. The heating probe 4 comprising a tungsten filament is inserted into the plasma region P. Also, the heating probe 4 is mounted in the chamber 7 via an insulating member, and it is not electrically connected to the chamber 7 which is a ground potential, so that the potential of the heating probe 4 falls in a floating potential.

Then, this heating probe 4 is connected to a pulse power supply 14 and is applied with a pulse voltage $V_{PP}$ such as described above in FIG. 1 to be heated. Now, the range of the high frequency vibration which the floating potential of the heating probe 4 can follow depends on an external circuit and it is determined on the basis of a floating capacitance of the entire circuit of the heating probe 4 to the ground. Accordingly, in order that the floating potential of the heating probe 4 can vibrate to a frequency as high as possible, it is necessary to remove the influence of this floating capacitance as much as possible.

As one method therefor, in a circuit embodiment shown in FIG. 4, a dummy probe 18 connected to the pulse power supply 14 is provided. Measurement of the floating potential of the heating probe 4 is performed using a method for measuring a difference potential between the heating probe 4 and the dummy probe 18 through a differential voltage amplifier 19 in a synchroscope 20 which is a detecting portion for detecting the floating potential difference. In this manner, by taking the potential difference from the dummy probe 18, the floating capacitance of the heating probe 4 to the ground can be removed. Incidentally, a filter 22 is for removing the high frequency vibration appearing at the heating probe 4 and for removing noise generated by plasma itself. Thus, the waveform in change of the floating voltage due to the heating voltage of the heating probe 4 is obtained in the synchroscope 20, and an electron energy distribution can be obtained from the floating potential difference, the pulse voltage, the probe floating potential, or the like, as described later. For example, the calculation of the electron energy distribution is performed in a calculation section 24 comprising a microcomputer or the like, and the calculation result is displayed on a display section 26.

Next, a measuring method of an electron energy distribution in such a measuring apparatus will be explained.

Figure 5:
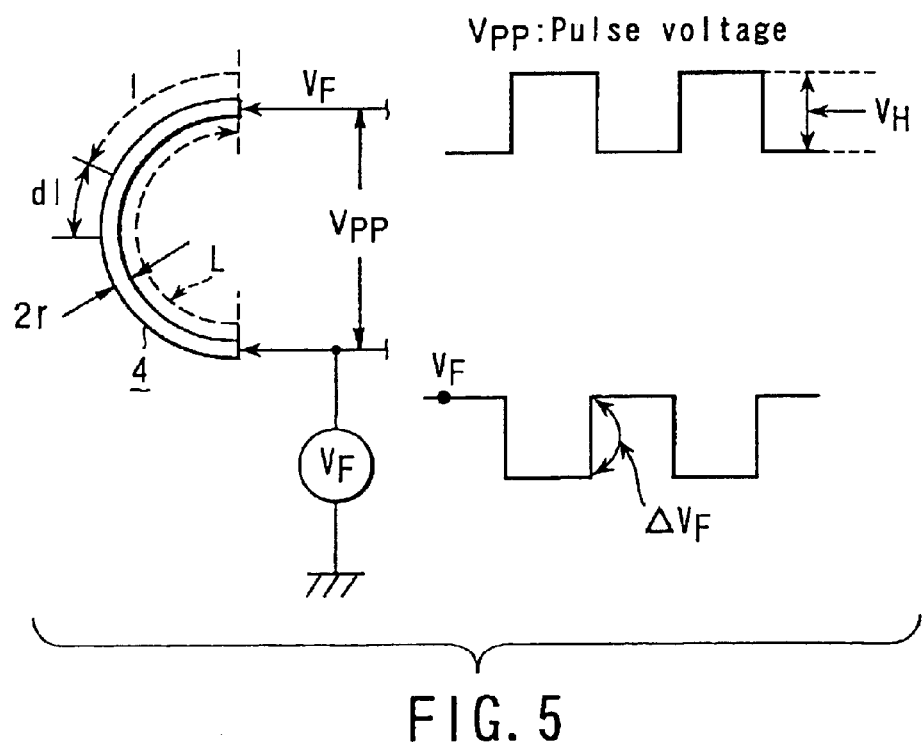
FIG. 5 is a diagram showing a state where pulse voltage is applied to a heating probe.
Figure 6:
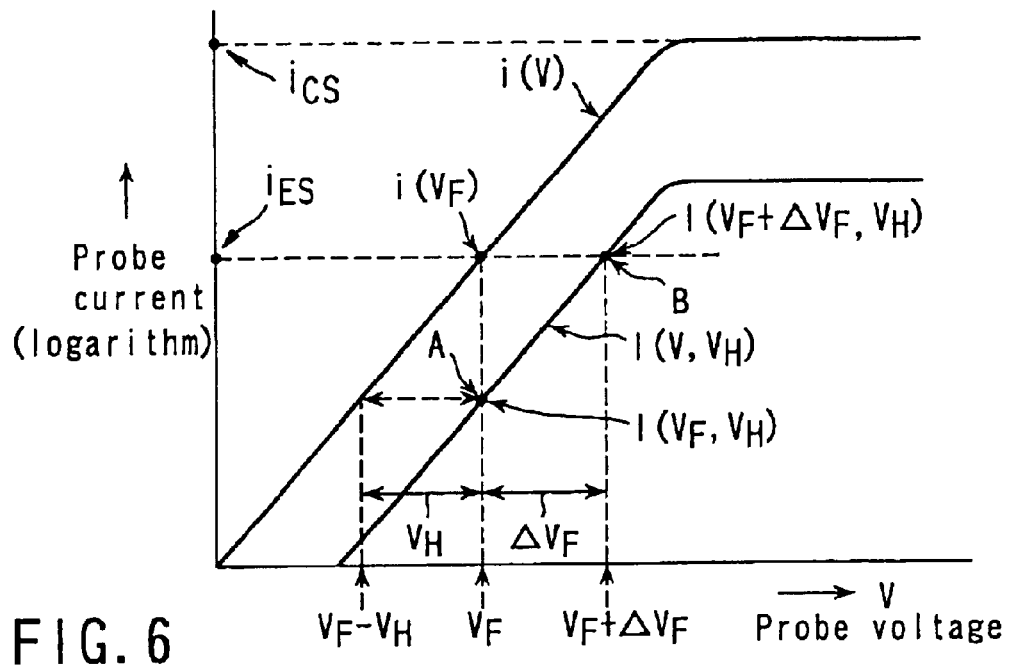
FIG. 6 is a graph for explaining a principle of a measuring method according to the present invention.

FIG. 5 is a diagram schematically showing the heating probe 4 and a pulse voltage $V_{PP}$ applied to the heating probe 4. FIG. 5 corresponds to FIG. 1. FIG. 6 shows a relationship between the pulse voltage $V_H$ and the probe current i and corresponds to FIG. 3.

With reference to FIG. 5, a method of obtaining a probe collection current (current density)—voltage characteristic i (V) from the principle of an emissive probe method will be explained. Here, $V_H$ is a pulse height of a pulse voltage, $V_F$ is a probe floating potential, and $\Delta V_F$ is a floating potential difference. Assume that the length of the heating probe 4 is L and that probe filament has a diameter r. Then, the potential of the probe is always floating. The total collection electron current must be equal to the probe collection current, in both the voltage period (H level) of the pulse voltage $V_{PP}$ and the no-voltage period (L level) thereof. In any region where the probe potential is lower than the plasma potential $V_P$, the probe electron current is constant at the value $i_{ES}$ (emission electron saturated current), irrespective of the probe potential. Hence, the relation between both collection currents can be expressed by the following equation (3).

$$\int_0^L 2\pi r\, dl\, i\left(V_F + \Delta V_F - \frac{l}{L}V_H\right) = 2\pi r L i(V_F) \quad (3)$$

In the equation (3), i(V), which is identical to the probe collection current Ic that has been referred to in the description concerning FIGS. 1 to 3, is used to clarify the principles of the invention. For the similar reason, $i_{ES}$ is used for the emission current. The left side of the equation (3) indicates a total probe collection current when the pulse voltage $V_{PP}$ is $V_H$ (voltage period). The right side thereof indicates a total probe collection current that flows when the pulse voltage $V_{PP}$ is 0 volts (no-voltage period). In the equation (3), r indicates a radius of the heating probe 4. The left side of the equation (3) may be transformed to the following equation (4):

$$\int_0^L 2\pi r\, dl\left(V_F + \Delta V_F - \frac{l}{L}V_H\right) = 2\pi r \int_{V_F+\Delta V_F}^{V_F+\Delta V_F-V_H} i(V)\left(-\frac{L}{V_H}\right) dV \quad (4)$$

$$= 2\pi r \frac{L}{V_H} \int_{V_F+\Delta V_F-V_H}^{V_F+\Delta V_F} i(V)\, dV$$

Accordingly, the following equation (5) will be obtained from the relationship between the left side of the equation (3) and the equation (4).

$$i(V_F) = \frac{1}{V_H} \int_{V_F+\Delta V_F-V_H}^{V_F+\Delta V_F} i(V)\, dV \quad (5)$$

Then, when the equation (5) is transformed, the following equation (6) will be obtained.

$$i(V_F) = \frac{1}{V_H} \int_{V_F-V_H}^{V_F} i(V + \Delta V_F)\, dV \quad (6)$$

Here, the analysis of the emissive probe method will be performed using FIG. 6. First, the current I ($V_F$, $V_H$) at a point A is determined according to the following equation (7).

$$I(V_F, V_H) = \frac{1}{V_H} \int_{V_F-V_H}^{V_F} i(V)\, dV \quad (7)$$

Furthermore, the current I ($V_F+\Delta V_F$, $V_H$) at a point B will be determined according to the following equation (8).

$$I(V_F + \Delta V_F, V_H) = \frac{1}{V_H} \int_{V_F+\Delta V_F-V_H}^{V_F+\Delta V_F} i(V)\, dV \quad (8)$$

$$= \frac{1}{V_H} \int_{-V_H}^{0} i(V + V_F + \Delta V_F)\, dV$$

Accordingly, the following equation (9) will be determined from the relationship between the above equation (7) and the equation (8).

$$i(V_F) = \frac{1}{V_H} \int_{-V_H}^{0} i(V + V_F + \Delta V_F)\, dV \quad (9)$$

Then, when a general equation obtained according to the equation (6) or (9) is transformed to a differential form, the following equation (10) can be obtained $$\frac{d}{dV_H}\{V_H i(V_F - \Delta V_F)\} = i(V_F - V_H) \quad (10)$$

The form of i (V) can be obtained according to this equation (10) using the respective measured values of $\Delta V_F$ and $V_F$ to $V_H$. Here, for example, the pulse height $V_H$ of the pulse voltage $V_{PP}$ is accurately changed to various values within the range of 5 to 50 volts, and $\Delta V_F$ or $V_F$ is measured for each change. In this case, the pulse height $V_H$ is increased or decreased little by little, for example, for every 50 mV, and $\Delta V_F$ or $V_F$ is measured for each increase or decrease. Thus, when i (V) is obtained, the function F(E) of the electron energy distribution can be obtained according to the following equation (11).

$$F(E) = F(eV) = k_1 \frac{1}{\sqrt{V}} \frac{d^2 i}{dV^2}, \quad (11)$$

where $k_1$ is a proportional constant.

Figure 7:
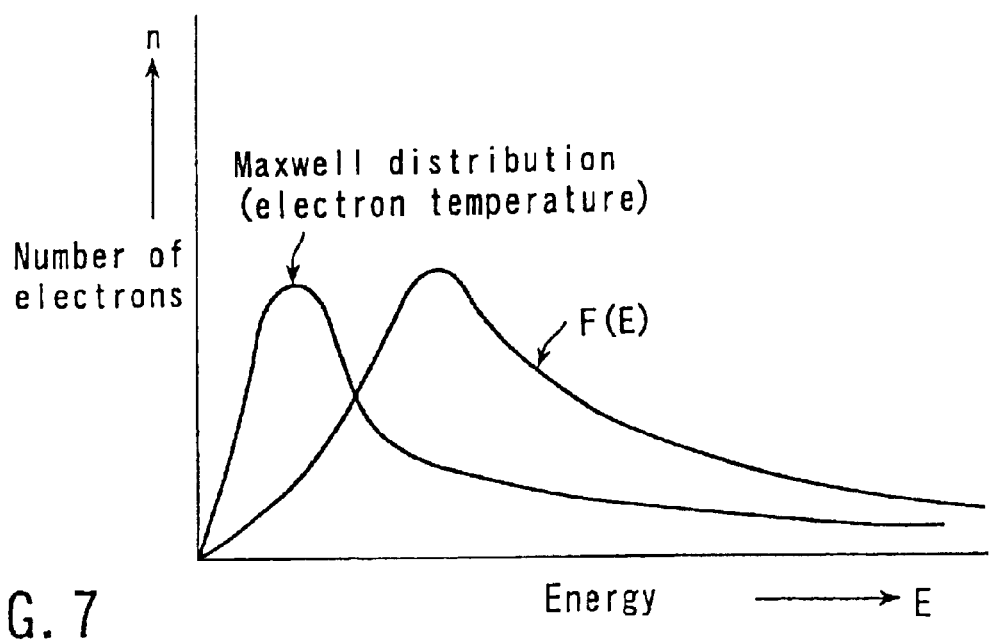
FIG. 7 is a graph showing one example of a relationship between electron energy (E) and the number of electrons (n)

The calculation of each of the above equations can be performed in the calculation section 24 (refer to FIG. 4), and the function F(E) obtained can be displayed on, for example, the display section 26. When the function F(E) of the electron energy distribution is obtained in the above manner, it will be displayed, for example, as shown in FIG. 7. In FIG. 7, the horizontal axis denotes energy (E) and the vertical axis denotes the number of electrons (n), respectively. As shown in FIG. 7, the distribution of the electron temperature follows a Maxwell distribution, but the electron energy distribution obtained by the method of the present invention is largely shifted from the Maxwell distribution and it reflects the electron energy distribution more accurately.

In the above embodiment, the measuring apparatus has been explained, assuming that it is equipped in the film forming apparatus such as a CVD apparatus, a sputtering device or the like, but, of course, the present invention is not limited to such an apparatus. Of course, the measuring apparatus may be equipped in various apparatuses where various processings are conducted by applying high frequency power to generate plasma, such as an etching apparatus, an annealing apparatus or the like, so that a similar effect can be obtained easily. The heating probe is mounted in an insulating state to a potential of a chamber (a chamber where a plasma region is generated) of each of these processing apparatuses, and it is put in a floating state potentially.

In the measuring method of an electron energy distribution in plasma and an apparatus therefor, a floating potential difference is obtained while the pulse height of a pulse voltage applied to a heating probe is accurately changed. An accurate electron energy distribution in high frequency plasma can therefore be obtained.

A first modification of the measuring apparatus according to the invention will be described, with reference to FIG. 8. The components similar or identical to those shown in FIG. 4 are designated at the same reference numerals and will not described in detail.

Figure 8:
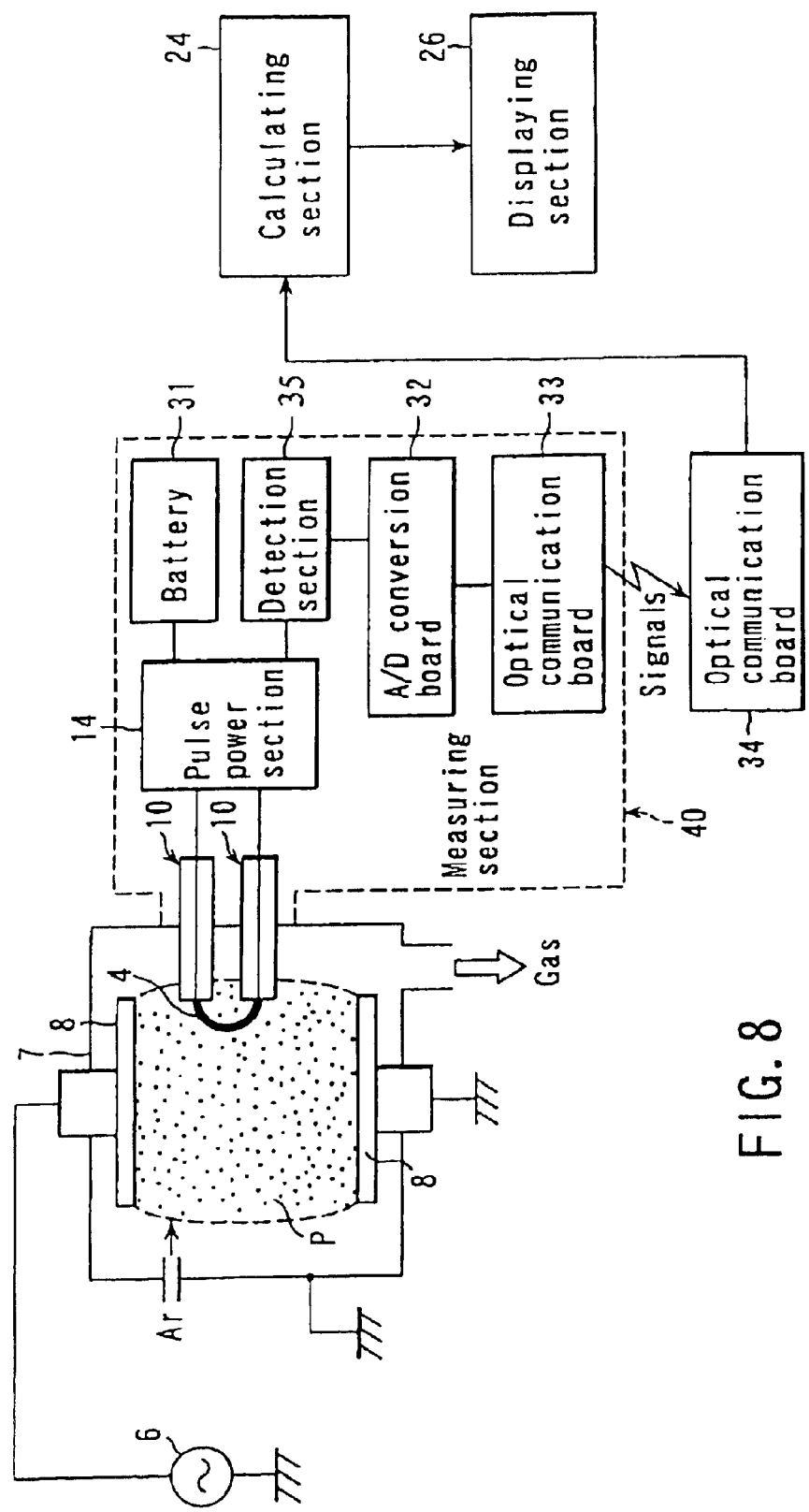
FIG. 8 is a diagram illustrating a first modification of the measuring apparatus according to the invention.

As FIG. 8 shows, the first modification comprises a measuring section 40, an optical communication board 34, a calculating section 24, and a displaying section 26. The measuring section 40 generates data items representing a floating potential difference, a pulse voltage, a probe floating potential and the like, from which an electron energy distribution is calculated. The optical communication board 34 transmits, by radio, the data items generated by the measuring section 40. The calculating section 24 comprises a microcomputer or the like and processes the data items transmitted from the board 34, thereby to calculate the electron energy distribution.

The measuring section shown in FIG. 4 comprises the pulse power supply 14, the dummy probe 18, the filter 22 and the synchroscope 20. By contrast, the measuring section 40 comprises a pulse power section 14, a high-performance battery 31, a detection section 35, an A/D conversion board 32, and an optical communication board 33. The battery 31 supplies power to the pulse power section 14.

The detection section 35 comprises circuit elements formed integral on one substrate. The section 35 operates at high speed to detect a difference between the floating potential in the voltage period of the pulse voltage and the floating potential in the no-voltage period of the pulse voltage. The A/D conversion board 32 is provided integral with the detection section 35 or on another substrate. The board 32 converts the data obtained by the detection section 35, to digital data.

The optical communication board 33 converts the digital data output from the A/D conversion board 32, to an optical signal. The board 33 transmits the optical signal to the optical communication board 34. The board 33 receives an optical control signal from the optical communication board 34 and converts the control signal to an electric signal. The electric signal controls the detection section 35. The calculating section 24 may comprise a personal computer or the like. In this case, the section 24 can not only calculate the electron energy distribution, but also control various measuring positions. This realizes remote measuring. As a result, the measuring apparatus can be small and the freedom of arranging the component increases.

The measuring section 40, in particular, is made as small as possible geometrically. The capacitance of the measuring section 40, which floats with respect to the ground potential, is thereby minimized. The data obtained by measuring is transferred between the optical communication board 33 and the optical communication board 34. The data is thus input to the calculation section 24. The calculation section 24 calculates the electron energy distribution from the data. The displaying section 26 displays the electron energy distribution. Since optical communication is utilized to transfer the data between the measuring section 40 and the calculating section 24, no cables connects the sections 40 and 24. This helps further decrease the floating capacitance.

Since the floating capacitance is minimized, the upper limit of the frequency that can be measured of the high-frequency power supply 6. Hence, the measuring section 40 can measure the electron energy distribution in plasma generated at 60 MHz or any higher frequency, as well as the electron energy distribution in plasma generated at 13.56 MHz or 27 MHz as is practiced at present.

Thanks to the optical communication between the measuring section 40 and the calculating section 24, using no cables, the components can be positioned remote from one another. The optical communication brings forth other advantages and helps to provide a high-performance measuring apparatus.

Figure 9:
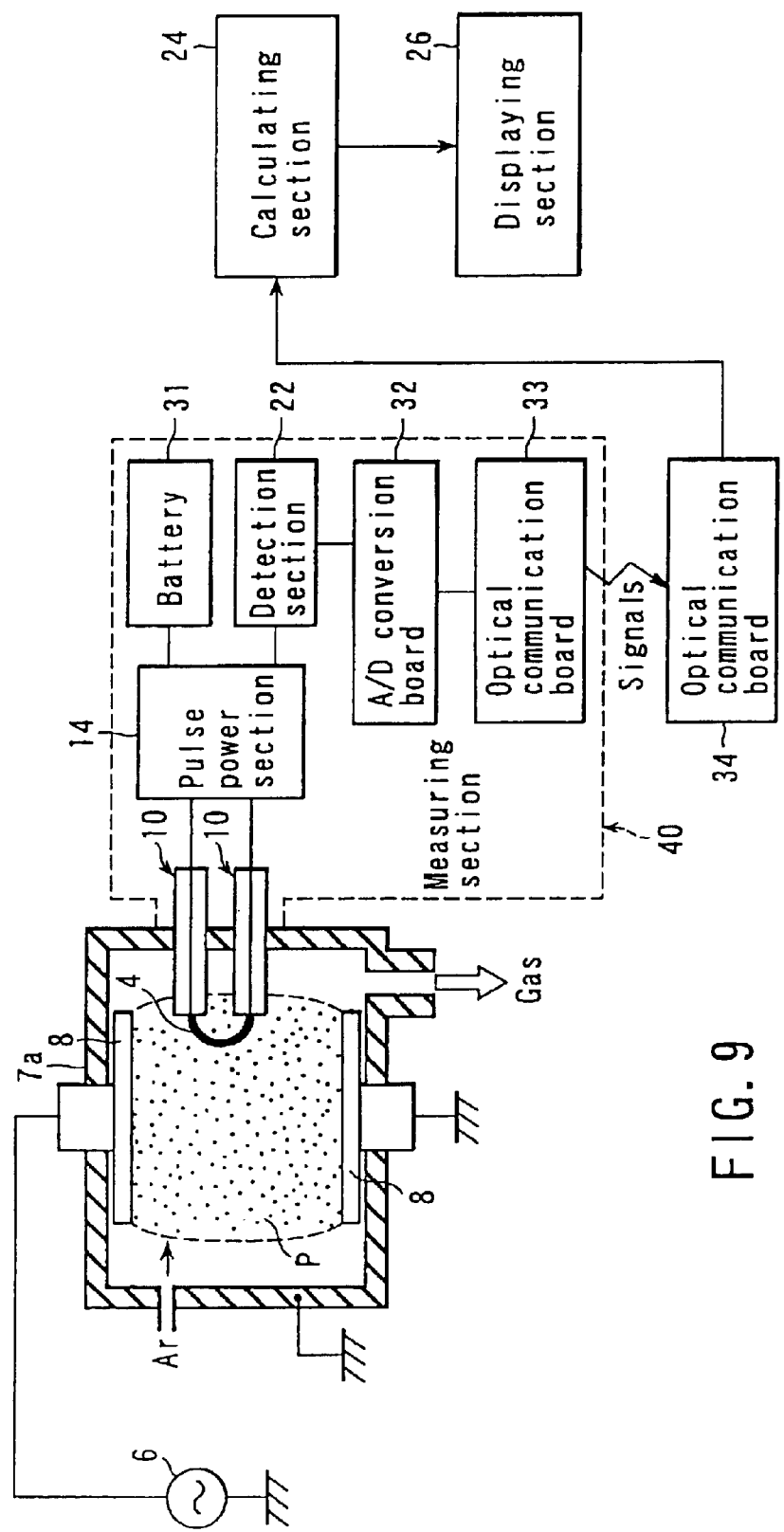
FIG. 9 is a diagram depicting a second modification of the measuring apparatus according to the invention.

A second modification of the measuring apparatus according to the invention will be described, with reference to FIG. 9. The components similar or identical to those shown in FIG. 8 are designated at the same reference numerals and will not described in detail.

In the second modification, the chamber 7a is made of insulating material. In the method of measuring an electron energy distribution, according to the present invention, a probe current generated from plasma need not be supplied in order to measure the distribution. The distribution can be measured even if the chamber 7a, in which plasma is generated, is made of insulating material. The chamber 7a may be made of insulating material such as alumina. If this case, too, it is possible to measure the electron energy distribution in the plasma generated in the chamber 7a.

The second modification can measure electron energy distribution, because the probe used is set at a specific capacitance that floats with respect to the ground potential.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A measuring apparatus for measuring an electron energy distribution in a plasma region generated by a high frequency power, comprising:
   a heating probe having a probe portion which is inserted in the plasma region to be heated by application of a pulse voltage;
   a pulse power supply which applies heating pulses to the heating probe to heat the probe portion to a state that the probe portion can emit thermions;
   a measuring section which detects a difference in floating voltage between a voltage period (II level) and a no-voltage period (L level) o the pulse voltage; and
   a calculating section which obtains an electron energy distribution in the plasma region on the basis of the detected value detected by the measuring section,
   wherein the pulse power supply varies a pulse height (H level) of the pulse when applying the pulse voltage to the heating probe.

2. A measuring apparatus according to claim 1, wherein the measuring apparatus is equipped in a processing apparatus for performing one of a film forming processing, an etching processing and an annealing processing, and
   the probe portion is mounted in a chamber of the processing apparatus where the plasma region is generated, in an electrically insulated state, and the heating probe is in a potentially floating state.

3. A measuring apparatus according to claim 2, wherein the chamber is made of insulating material.

4. A measuring apparatus according to claim 1, further comprising:
   an A/D converting section which is provided on a same substrate along with the measuring section or on another substrate and which converts data obtained in the measuring section to digital data;
   a first signal converting section which has a function of converting an electric signal to an optical signal and vice versa and a function of performing communication and which converts the data from the A/D converting section, to an optical signal and transmits the optical signal, or converts a received optical control signal, to an electric signal; and
   a second signal converting section which has a function of converting an electric signal to an optical signal and vice versa and a function of performing communication and which converts the data from the first signal converting section, to an electric signal or converts the control signal to an optical signal.

5. A measuring apparatus according to claim 4, which is designed to be provided in a processing apparatus for forming film, performing etching or performing annealing, by using plasma generated by application of high-frequency power, and in which the probe is electrically insulated from the chamber of the processing apparatus, in which the plasma region is provided, and is set at a floating potential.

6. A measuring apparatus according to claim 5, wherein the chamber is made of an insulating material.

7. A measuring apparatus according to claim 1, further comprising a display section which displays a table or a graph showing the electron energy distribution obtained by the calculating section.

8. A measuring apparatus according to claim 1, wherein the measuring section comprises circuit elements integrated on a substrate, and which further comprises:

an A/D converting section which is provided along with a detection section or provided on another substrate, and which converts measured data obtained by the detection section, into digital data, a first optical signal converting section which has a function of converting an electric signal to an optical signal and vice versa and a function of performing communication, and which converts the measured data from the A/D conversing section into an optical signal and transmits the optical signal, or converts an optical control signal received into an electric signal;

a second optical signal converting section which has a function of converting an electric signal into an optical signal and vice versa and a function of performing communication, and which converts the measured data from the first optical signal converting section into an electric signal or converts the control signal into an optical signal, and a displaying section which displays a table or a graph showing the electron energy distribution obtained by the calculating section, a wherein the calculating section obtains the electron energy distribution in the plasma region on the basis of the measured data given by the second optical signal converting section, and wherein the measuring section comprises circuit elements interpreted.

9. A measuring apparatus according to claim 8, further comprises a floating capacitance reducing unit which reduces a floating capacitance to the ground.

10. A measuring apparatus according to claim 9, wherein the floating capacitance reducing unit comprises a dummy probe connected to the pulse power supply.

11. A measuring apparatus according to claim 9, wherein the floating capacitance reducing unit comprises an optical communication unit which performs optical communication to transmit data between the measuring section and the calculating section.

* * * * *